(12) United States Patent
Qian et al.

(10) Patent No.: US 11,887,923 B2
(45) Date of Patent: Jan. 30, 2024

(54) WIRING DESIGN METHOD, WIRING STRUCTURE, AND FLIP CHIP

(71) Applicant: NEXTVPU (SHANGHAI) CO., LTD., Shanghai (CN)

(72) Inventors: Aofeng Qian, Shanghai (CN); Gang Qin, Shanghai (CN); Xinpeng Feng, Shanghai (CN); Ji Zhou, Shanghai (CN)

(73) Assignee: NEXTVPU (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 17/640,752

(22) PCT Filed: Jun. 10, 2021

(86) PCT No.: PCT/CN2021/099357
§ 371 (c)(1),
(2) Date: Mar. 4, 2022

(87) PCT Pub. No.: WO2022/028100
PCT Pub. Date: Feb. 10, 2022

(65) Prior Publication Data
US 2023/0154840 A1    May 18, 2023

(30) Foreign Application Priority Data
Aug. 6, 2020   (CN) .......................... 202010780502.6

(51) Int. Cl.
*H01L 23/498*   (2006.01)
*H01L 21/48*    (2006.01)
*H01L 23/00*    (2006.01)

(52) U.S. Cl.
CPC ...... *H01L 23/49838* (2013.01); *H01L 21/486* (2013.01); *H01L 23/49827* (2013.01);
(Continued)

(58) Field of Classification Search
None
See application file for complete search history.

(56) References Cited

U.S. PATENT DOCUMENTS

2004/0188856 A1*  9/2004  Hsu ..................... H01L 23/50
                                                          257/E23.079
2008/0251286 A1* 10/2008  Zhao .................... H05K 1/114
                                                          257/E23.079

(Continued)

FOREIGN PATENT DOCUMENTS

CN     101587877 A   11/2009
CN     101728351 A    6/2010
(Continued)

*Primary Examiner* — Hung K Vu
(74) *Attorney, Agent, or Firm* — Kilpatrick Townsend & Stockton LLP

(57) ABSTRACT

A wiring design method and a wiring structure for a package substrate in a flip chip, and a flip chip. The wiring design method includes: arranging bump pads in an array of rows and columns, wherein the bump pads are configured to bond with conductive bumps on a flip chip die, and the bump pads comprise signal pads and non-signal pads; providing the non-signal pad with a via hole; and using a layer of wiring to lead a subset of the signal pads out of an orthographic projection region of the flip chip die on the package substrate, wherein the subset of the signal pads is configured to carry all functional signals required by design specifications of the flip chip die for the array of the bump pads.

19 Claims, 10 Drawing Sheets

(52) U.S. Cl.
CPC .... *H01L 24/16* (2013.01); *H01L 2224/16227* (2013.01); *H01L 2224/16238* (2013.01); *H01L 2924/14361* (2013.01)

(56) References Cited

U.S. PATENT DOCUMENTS

| | | | |
|---|---|---|---|
| 2011/0074047 A1* | 3/2011 | Pendse | H01L 24/81 257/782 |
| 2011/0095418 A1 | 4/2011 | Lim et al. | |
| 2012/0098120 A1* | 4/2012 | Yu | H01L 24/13 257/737 |
| 2018/0286798 A1 | 10/2018 | Waidhas et al. | |
| 2020/0211994 A1* | 7/2020 | Lai | H01L 24/14 |

FOREIGN PATENT DOCUMENTS

| | | | |
|---|---|---|---|
| CN | 102487021 A | 6/2012 | |
| CN | 103367293 A | 10/2013 | |
| CN | 104851863 A | 8/2015 | |
| CN | 111739807 A | 10/2020 | |
| JP | 2006100710 A | 4/2006 | |
| JP | 2011091407 A | 5/2011 | |
| JP | 2011228486 A | 11/2011 | |
| JP | 2012119648 A | 6/2012 | |

* cited by examiner

WIRING DESIGN METHOD, WIRING STRUCTURE, AND FLIP CHIP

CROSS REFERENCE TO RELATED APPLICATIONS

The present application is a U.S. National Stage of International Application No. PCT/CN2021/099357, filed on Jun. 10, 2021, which claims the priority to Chinese Patent Application No. 2020107805026, filed on Aug. 6, 2020. The entire disclosure of the PCT/CN2021/099357 is incorporated herein by reference for all purposes.

TECHNICAL FIELD

The present disclosure relates to the field of chip packaging, and in particular to a wiring design method and a wiring structure for a package substrate in a flip chip, and a flip chip.

BACKGROUND

There are problems related to a wiring design of a package substrate in a flip chip. In the related art, the design of a package substrate is complicated, which increases the difficulty of substrate processing and delivery time, resulting in high substrate costs. In some practical applications, a package substrate often needs eight layers of wiring, and the signal quality is hardly guaranteed.

SUMMARY

According to a first aspect of the present disclosure, a wiring design method for a package substrate in a flip chip is provided. The flip chip comprises the package substrate and a flip chip die opposite to the package substrate. The method comprises the following steps: arranging bump pads in an array of rows and columns, wherein the bump pads are configured to bond with conductive bumps on the flip chip die, the bump pads comprise signal pads and non-signal pads, and the non-signal pads comprise power pads and ground pads; providing the non-signal pad with a via hole to electrically connect the power pad to a power layer in the package substrate and electrically connect the ground pad to a ground layer in the package substrate; and using a layer of wiring to lead a subset of the signal pads out of an orthographic projection region of the flip chip die on the package substrate, wherein the subset of the signal pads is configured to carry all functional signals required by design specifications of the flip chip die for the array of the bump pads.

According to a second aspect of the present disclosure, a wiring structure for a package substrate in a flip chip is provided. The flip chip comprises the package substrate and a flip chip die opposite to the package substrate. The wiring structure comprises: bump pads arranged in an array of rows and columns on the package substrate, wherein the bump pads are configured to bond with conductive bumps on the flip chip die, the bump pads comprise signal pads and non-signal pads, and the non-signal pads comprise power pads and ground pads; via holes comprising a power via hole and a ground via hole, wherein the power via hole is configured to electrically connect the power pad to a power layer in the package substrate, and the ground via hole is configured to electrically connect the ground pad to a ground layer in the package substrate; and a layer of wiring configured to lead a subset of the signal pads out of an orthographic projection region of the flip chip die on the package substrate, wherein the subset of the signal pads is configured to carry all functional signals required by design specifications of the flip chip die for the array of the bump pads.

According to a third aspect of the present disclosure, a flip chip is provided, which comprises: a flip chip die, a package substrate opposite to the flip chip die, and a wiring structure as described in the second aspect of the present disclosure.

BRIEF DESCRIPTION OF THE DRAWINGS

The drawings exemplarily show embodiments and form a part of the specification, and are used to explain exemplary implementations of the embodiments together with a written description of the specification. The embodiments shown are merely for illustrative purposes and do not limit the scope of the claims. Throughout the drawings, identical reference signs denote similar but not necessarily identical elements.

DETAILED DESCRIPTION

Figure 1:
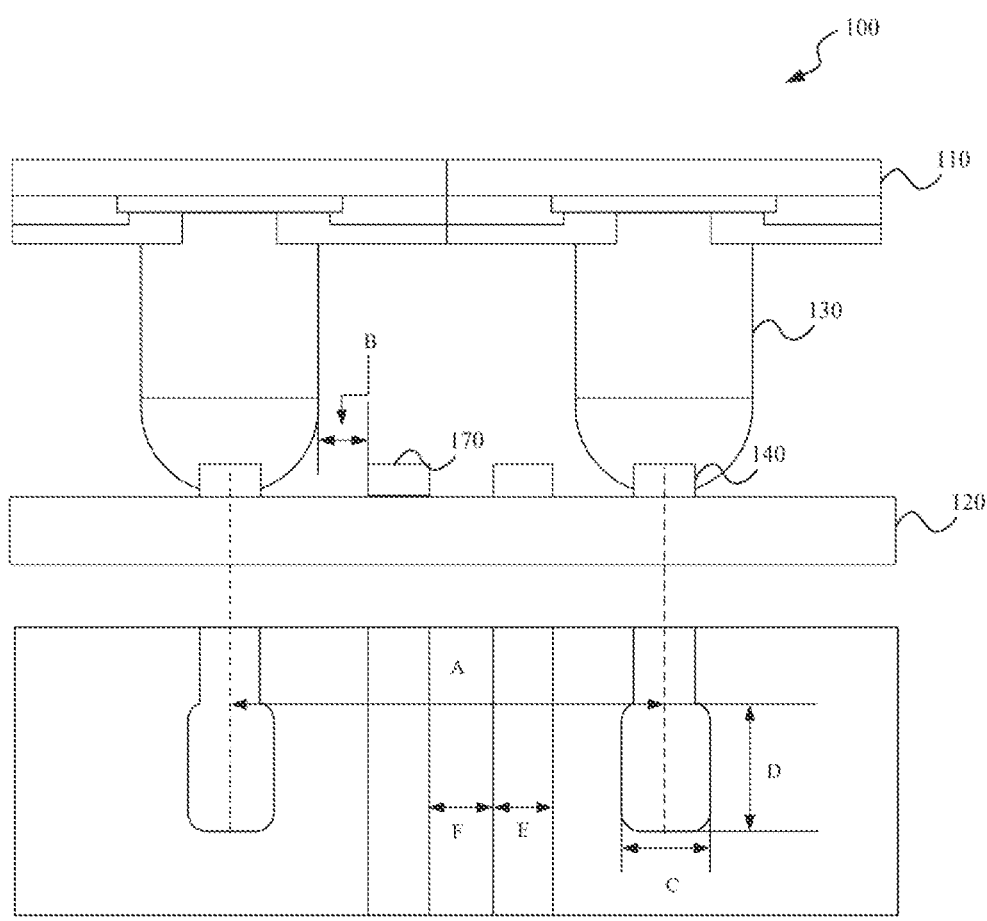
FIG. 1 is a cross-sectional schematic diagram and a schematic top view of a structure of a flip chip according to an exemplary embodiment of the present disclosure.

It is to be understood that although terms such as first, second and third may be used herein to describe various elements, components, regions, layers and/or portion, these elements, components, regions, layers and/or portion should not be limited by these terms. These terms are merely used to distinguish one element, component, region, layer or portion from another. Therefore, a first element, component, region, layer or portion discussed below may be referred to as a second element, component, region, layer or portion without departing from the teaching of the present disclosure.

The terms used herein are merely for the purpose of describing specific embodiments and are not intended to limit the present disclosure. As used herein, the singular forms "a", "an", and "the" are intended to include plural forms as well, unless otherwise explicitly indicted in the context. It is to be further understood that the terms "comprise" and/or "include", when used in this specification, specify the presence of described features, entireties, steps, operations, elements and/or components, but do not exclude the presence or addition of one or more other features, entireties, steps, operations, elements, components and/or groups thereof. As used herein, the term "and/or" includes any and all combinations of one or more of the associated listed items, and the phrase "at least one of A and B" refers to only A, only B, or both A and B.

It is to be understood that when an element or a layer is referred to as being "on another element or layer", "connected to another element or layer", "coupled to another element or layer", or "adjacent to another element or layer", the element or layer may be directly on another element or layer, directly connected to another element or layer, directly coupled to another element or layer, or directly adjacent to another element or layer, or there may be an intermediate element or layer. On the contrary, when elements are referred to as being "directly adjacent to each other", there is no intermediate element or layer. However, under no circumstances should "on . . . " or "directly on . . . " be interpreted as requiring one layer to completely cover the underlying layer.

Embodiments of the present disclosure are described herein with reference to schematic illustrations (and intermediate structures) of idealized embodiments of the present disclosure. Because of this, variations in an illustrated shape, for example as a result of manufacturing techniques and/or tolerances, should be expected. Therefore, the embodiments of the present disclosure should not be interpreted as being limited to a specific shape of a region illustrated herein, but should comprise shape deviations caused due to manufacturing, for example. Therefore, the region illustrated in a figure is schematic in nature, and the shape thereof is neither intended to illustrate the actual shape of the region of a device, nor to limit the scope of the present disclosure.

Unless otherwise defined, all terms (including technical and scientific terms) used herein have the same meanings as commonly understood by those of ordinary skill in the art to which the present disclosure belongs. It is to be further understood that the terms such as those defined in commonly used dictionaries should be interpreted as having meanings consistent with the meanings thereof in relevant fields and/or in the context of this specification, and will not be interpreted in an ideal or too formal sense, unless thus defined explicitly herein.

In the related art, circular bump pads arranged in a plurality of rows are typically used for a package substrate of a flip chip. Because the circular bump pads occupy a large area, signal pads must be led out to the outside of the package substrate by means of different layers of wiring. For example, signal pads of the first and third rows are led out from a first layer by means of a signal line, and signal pads of the fifth and seventh rows are led out from a third layer by means of a signal line. In this way, with the addition of a power layer, a ground layer, a package solder ball layer, etc., the package substrate often requires a structure of eight or more layers. Moreover, a signal trace in the related art is usually realized on the basis of via in pad, which results in a small wiring width ire a central region of the package substrate, that is, in an orthographic projection region of a flip chip die on the package substrate. Only in a peripheral region of the package substrate can a normal wiring width be used, which leads to discontinuity of part of wiring impedance and affects the signal quality in wiring. In addition, a large number of via holes are used to realize the leading out of the signal pads, which causes the space for power wiring to be further reduced, and thus results in insufficient connection of power signals and brings about a voltage drop problem.

The embodiments of the present disclosure provide a wiring design method and a wiring structure for a package substrate in a flip chip, and a flip chip. By setting the shape, size, positions and/or orientations of bump pads, the space available for signal wiring is increased, and all required signal pads can be led out by means of a layer of wiring. In some embodiments, a design of a 4-layer package substrate may be realized. In some embodiments, in the package substrate manufactured by means of the wiring design method, no via hole is required for the signal pads, such that sufficient connection of a power supply may be realized, and the voltage drop on a power network may be ensured to be within a small range. In some embodiments, the wiring on all signal pads may have a uniform width on a signal path, thereby realizing continuous signal impedance so as to facilitate the improvement of signal quality.

FIG. 1 schematically shows a local structure of a flip chip 100 according to an exemplary embodiment of the present disclosure. An upper half portion of FIG. 1 is a partial cross-sectional schematic diagram of the flip chip 100, and a lower half portion of FIG. 1 is a schematic top view corresponding to the partial cross-sectional schematic diagram.

As shown in FIG. 1, the flip chip 100 comprises a flip chip die 110 and a package substrate 120, and the flip chip die 110 is arranged opposite the package substrate 120. A plurality of conductive bumps 130 are provided at one side of the flip chip die 110 that faces the package substrate 120, corresponding bump pads 140 are provided at one side of the package substrate 120 that faces the flip chip die 110, and the bump pads 140 bond with the conductive bumps 130. A solder ball (not shown) may be provided at the other side of the package substrate 120 and the package substrate 120 may be connected to a printed circuit board (PCB) (not shown) by means of the solder ball.

In some embodiments, the flip chip 100 shown in FIG. 1 may be a double data rate memory (DDR) chip, and more specifically, it may be a high-speed interface physical layer (DDR PHY IP) module in a high-speed memory interface such as DDR2, LPDDR2, DDR3, LPDDR3, DDR4, LPDDR4, LPDDR4X, DDR5, or LPDDR5. However, this is not intended to limit the scope of the present disclosure.

Figure 2:
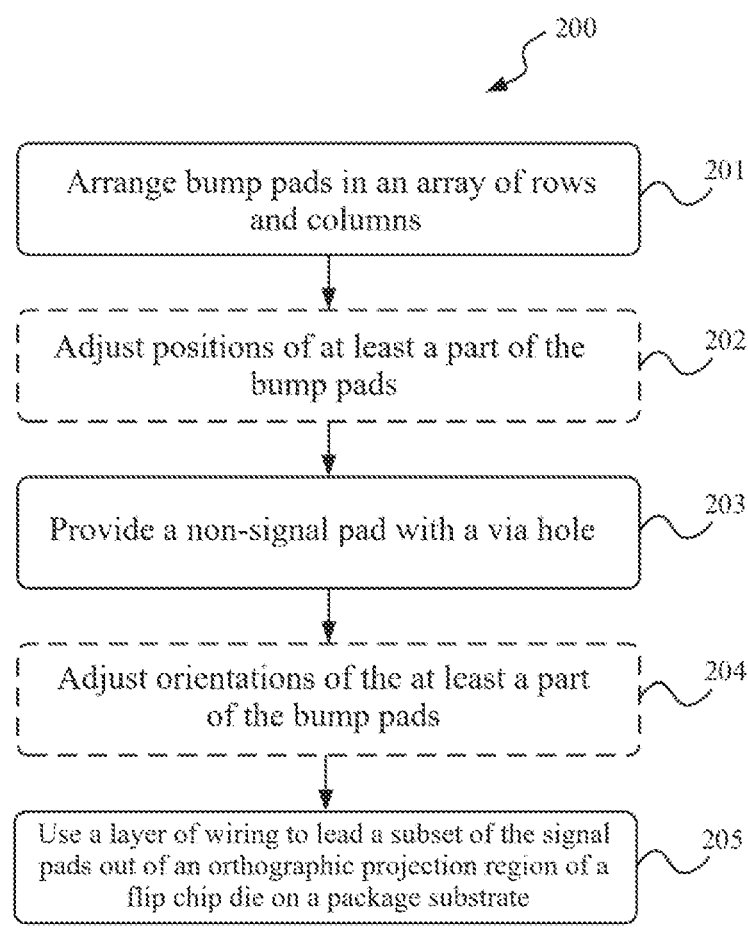
FIG. 2 is a flowchart of a wiring design method according to an exemplary embodiment of the present disclosure.

FIG. 2 is a flowchart of a wiring design method 200 according to an exemplary embodiment of the present disclosure. As shown in FIG. 2, the wiring design method 200 comprises: arranging bump pads in an array of rows and columns (step 201); providing a non-signal pad with a via hole (step 203); and using a layer of wiring to lead a subset of signal pads out of an orthographic projection region of a flip chip die on a package substrate (step 205). For the convenience of description, the orthographic projection region of the flip chip die on the package substrate is referred to as "orthographic projection region" for short hereinafter.

Figure 8:
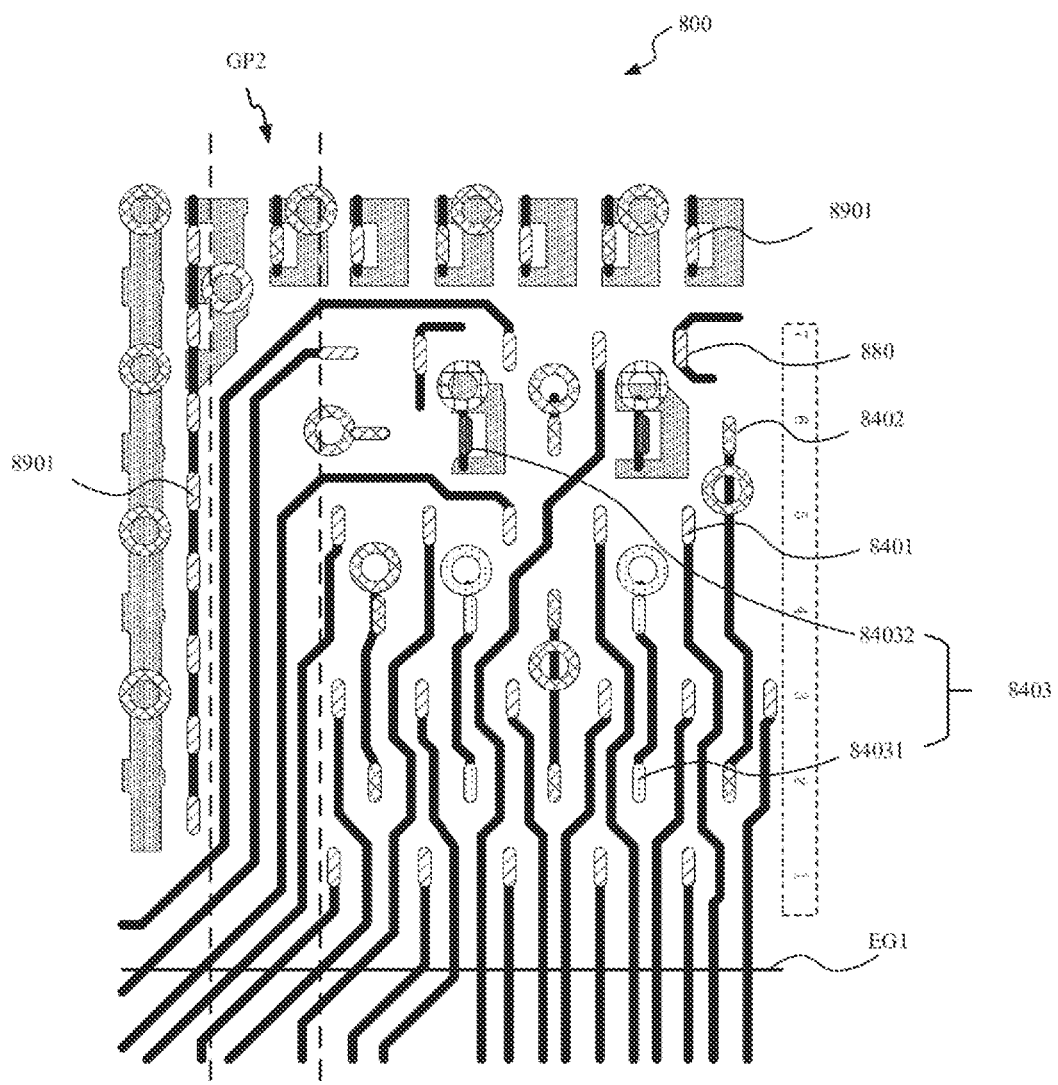
FIG. 8 is a schematic diagram of a left portion of a structure formed by means of another step of the method in FIG. 2 according to an exemplary embodiment of the present disclosure.
Figure 9:
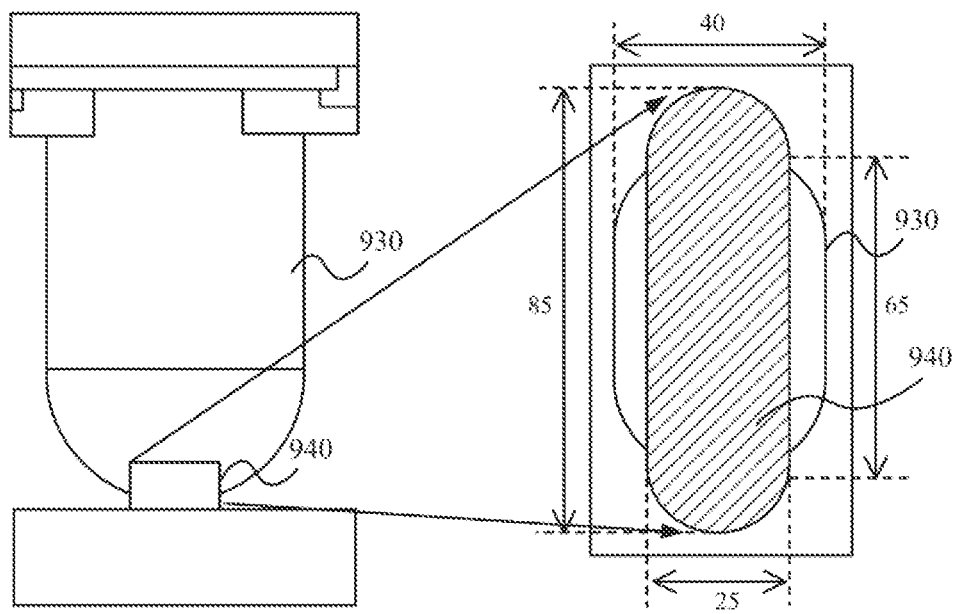
FIG. 9 is a cross-sectional schematic diagram and a schematic top view of conductive bumps and bump pads according to an exemplary embodiment of the present disclosure.
Figure 10:
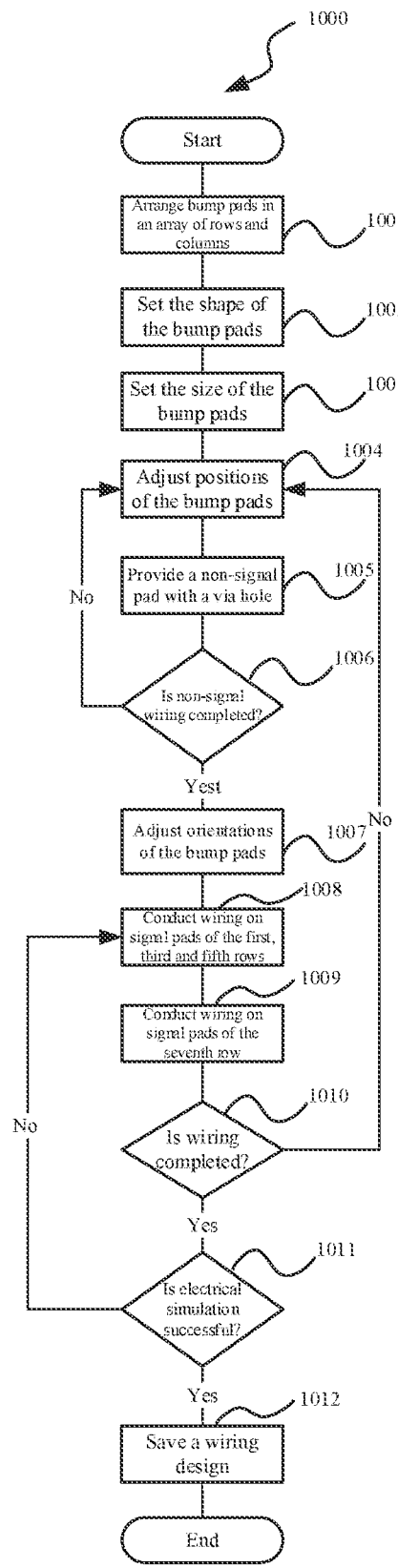
FIG. 10 is a flowchart as one example of the wiring design method in FIG. 2 according to an exemplary embodiment of the present disclosure.

FIGS. 3 to 9 schematically show a wiring structure formed by means of the wiring design method 200 of FIG. 2, and FIG. 10 shows one specific example of the wiring design method 200. For the purpose of illustration, the wiring design method 200 will be described in detail below in conjunction with the drawings. In step 201, bump pads are arranged in an array of rows and columns. The bump pads are configured to bond with conductive bumps on a flip chip die. The bump pads comprise signal pads and non-signal pads, and the non-signal pads comprise power pads and ground pads.

Figure 3:
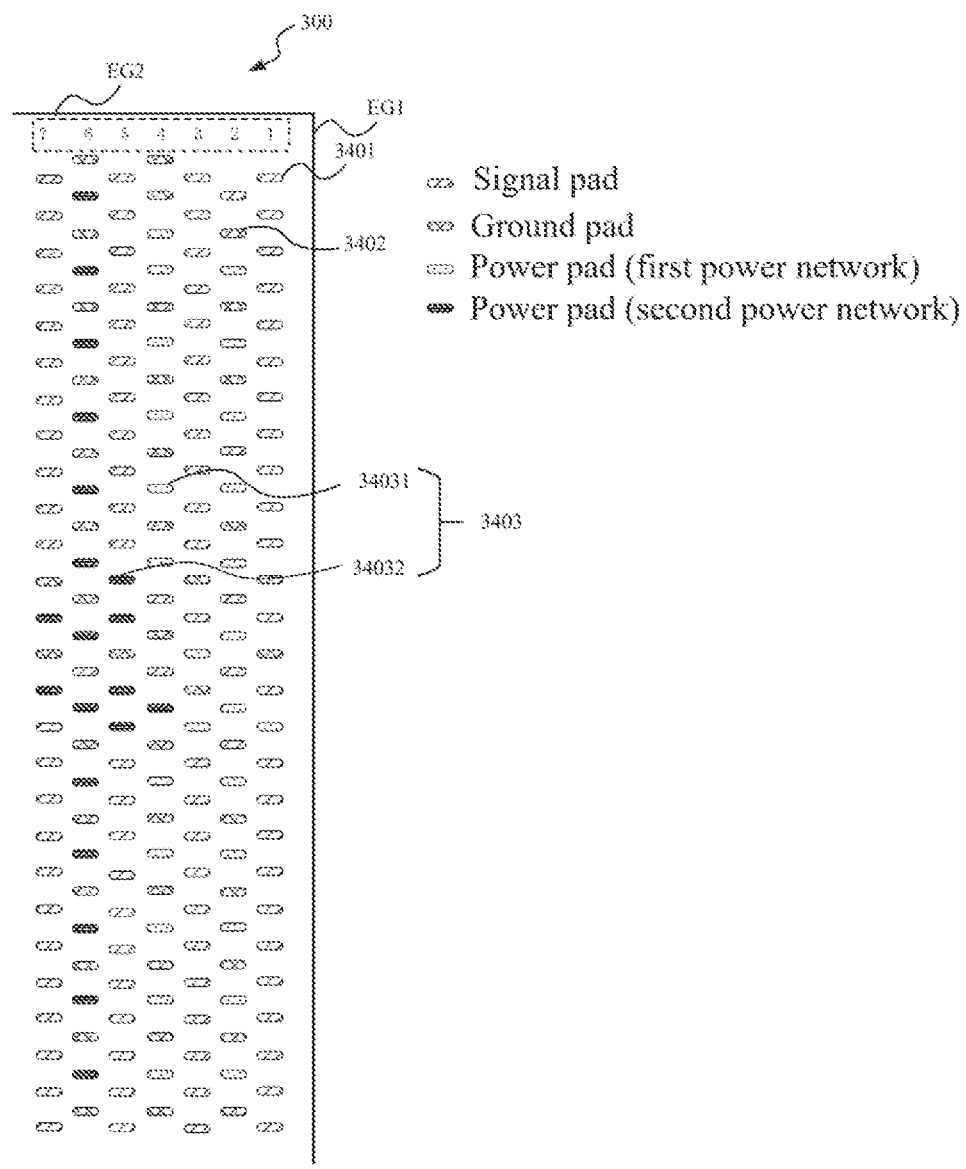
FIG. 3 is a schematic diagram of a structure formed by means of a step of the method in FIG. 2 according to an exemplary embodiment of the present disclosure.

In an example structure 300 in FIG. 3, the array of the bump pads comprises signal pads 3401 and non-signal pads, and the non-signal pads comprise power pads 3403 and ground pads 3402. More specifically, the power pad 3403 may be divided into a power pad 34031 of a first power network and a power pad 34032 of a second power network. For the convenience of description, a row direction of the array of the bump pads refers to a direction along one of two dimensions of the array, in which direction there are more bump pads or there is a larger span of the array, while a column direction refers to a direction along the other of the two dimensions of the array, in which direction there are fewer bump pads or there is a smaller span of the array. In an example of FIG. 3, an up-down direction serves as the row direction of the array of the bump pads. Numbers 1 to 7 in a dotted box indicate the number of rows of the bump pads, which are respectively the first, second, . . . , and seventh rows from right to left. Accordingly, in the example, a left-right direction serves as the column direction of the array of the bump pads. It is to be understood that seven rows of bump pads are merely illustrative and exemplary, and are not intended to limit the scope of the present disclosure.

According to some embodiments, the bump pads are arranged such that bump pads of odd-numbered rows and bump pads of even-numbered rows are staggered relative to each other in a column direction of an array. In the example of 3, bump pads of the first, third, fifth, and seventh rows and bump pads of the second, fourth, and sixth rows are staggered relative to each other in the column direction.

According to some embodiments, arranging the bump pads in the array of rows and columns may further comprise: arranging the bump pads such that the number of signal pads is greater than that of non-signal pads in each odd-numbered row, and such that the number of signal pads is less than that of non-signal pads in each even-numbered row. In the example of FIG. 3, in the odd-numbered rows, the number of signal pads 3401 is greater than that of non-signal pads 3402 and 3403. Taking the first row as an example, it comprises 24 signal pads 3401 and 3 non-signal pads. Taking the third row as an example, it comprises 23 signal pads 3401 and 4 non-signal pads. In the odd-numbered rows, the number of the signal pads 3401 accounts for the majority of the total number of pads, and the signal pads are mainly used for signal transmission. In the even-numbered rows, the number of signal pads is less than that of non-signal pads. Taking the second row as an example, it comprises 5 signal pads 3401 and 21 non-signal pads. Taking the fourth row as an example, it comprises 2 signal pads 3401 and 25 non-signal pads. In the even-numbered rows, the number of the non-signal pads accounts for the majority of the total number of pads, and the non-signal pads are mainly used for non-signal transmission. With such a pad arrangement, a gap between pads may be more fully used for wiring.

It is to be understood that the pad arrangement described above is exemplary, and other arrangement patterns may be used in other embodiments. In an alternative embodiment, arranging the bump pads in the array of rows and columns may further comprise: arranging the bump pads such that the number of signal pads is greater than that of non-signal pads in first n rows of the array, with 0<n<N, n being an integer, and N being a total number of rows of the array. Here, the first n rows of the array refer to n consecutive rows, starting from a row in a column direction that is closest to one edge of an orthographic projection region, in the array of the bump pads. In the example of FIG. 3, the total number of rows of the array N is 7, and edges of the orthographic projection region of the flip chip die comprise a first edge EG1 in a row direction (an up-down direction) of the array and a second edge EG2 in the column direction (a left-right direction) of the array. Then, the first n rows of the array refer to n consecutive rows, starting from a row in a column direction that is closest to one edge (that is, the first edge EG1) of an orthographic projection region, in the array of the bump pads. For example, when n is 3, the first n rows refer to the first to third rows shown in FIG. 3. It should be understood that only the meaning of the first n rows is described above with reference to FIG. 3, but it is not required that a pad arrangement pattern shown in FIG. 3 meets the condition that the number of signal pads is greater than that of non-signal pads in the first n rows.

In some embodiments, the method 200 may optionally comprise step 202, as indicated by a dotted box in FIG. 2. In step 202, positions of at least a part of the bump pads are adjusted such that a part of power pads in different rows can share a via hole and a part of ground pads in different rows can share a via hole.

Figure 4:
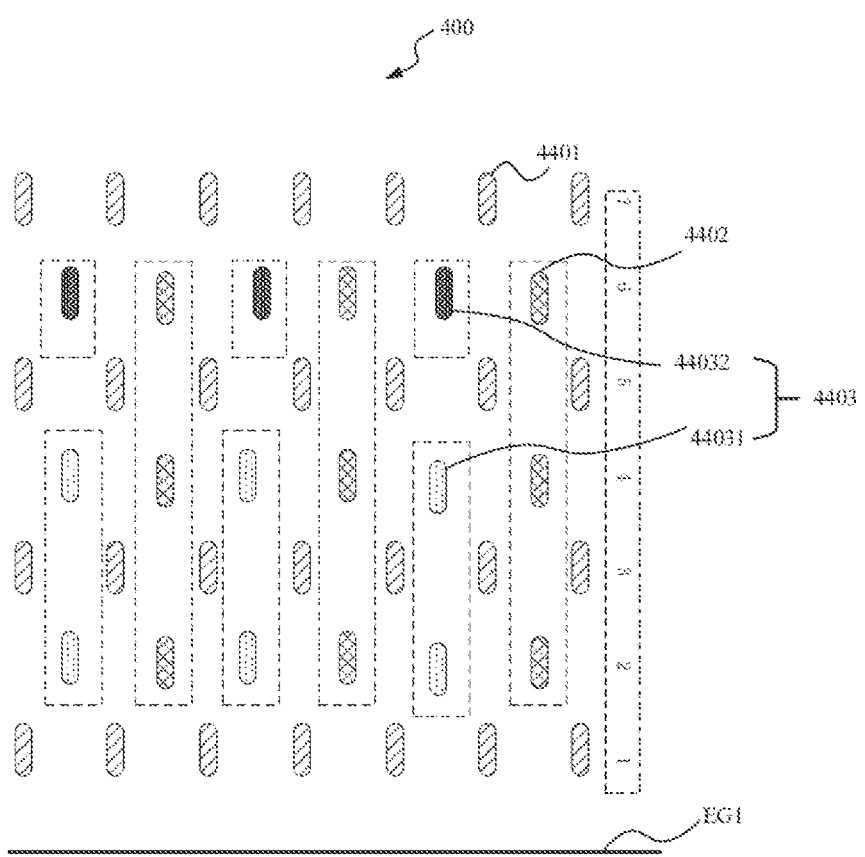
FIG. 4 is a schematic diagram of a structure formed by means of another step of the method in FIG. 2 according to an exemplary embodiment of the present disclosure.

With reference to FIG. 4, an example structure 400 is a partial enlargement of an example structure 300 of FIG. 3, and is shown to be rotated by 90 degrees with respect to the example structure 300 for the clarity of illustration. In this case, the left-right direction is a row direction, and the up-down direction is a column direction. The example structure 400 comprises signal pads 4401, ground pads 4402 and power pads 4403, and the power pad 4403 comprises a power pad 44031 of a first power network and a power pad 44032 of a second power network. FIG. 4 further shows the first edge EG1 of the orthographic projection region.

By adjusting the positions of the bump pads, three ground pads 4402 in the sixth, fourth, and second rows can share the via hole, and power pads 44031 of the first power network in the fourth and second rows can share the via hole. The sharing of a via hole can reduce the number of via holes and thus avoid occupying too much wiring space.

According to some embodiments, adjusting the positions of the bump pads may comprise: arranging a plurality of power pads in different rows to be directly opposite to each other in a column direction; and arranging a plurality of ground pads in different rows to be directly opposite to each other in the column direction. In this context, the phrase "pads A and B being directly opposite to each other" means that the pads A and B are spaced apart from each other, and there is no additional pad therebetween. In an example of FIG. 4, ground pads 4402 in different even-numbered rows (the second, fourth, and sixth rows) are directly opposite to each other in the column direction, and power pads 44031 of the first power network in different even-numbered rows (the second and fourth rows) are directly opposite to each other.

According to some embodiments, arranging the plurality of power pads in different rows to be directly opposite to each other in the column direction may comprise: arranging the plurality of power pads in different rows to be aligned in the column direction. Still referring to FIG. 4, the power pads 44031 of the first power network in different even-numbered rows (the second and fourth rows) are aligned in the column direction, as shown by dotted boxes in the figure.

According to some embodiments, arranging the plurality of ground pads in different rows to be directly opposite to each other in the column direction may comprise: arranging the plurality of ground pads in different rows to be aligned in the column direction. Still referring to FIG. 4, the ground pads 4402 in different even-numbered rows (the second, fourth, and sixth rows) are aligned in the column direction, as shown by dotted boxes in the figure.

In the above embodiment, an adjustment to the positions of the bump pads has been described with reference to the specific pad arrangement pattern shown in FIG. 4. It is to be understood that in other embodiments, such a pad position adjustment is also applicable to other pad arrangement patterns, that is, a plurality of power pads in different rows are arranged to be directly opposite to each other in a column direction, and a plurality of ground pads in different rows are arranged to be directly opposite to each other in the column direction.

In step 203 the non-signal pad is provided with the via hole to electrically connect the power pad to a power layer in the package substrate and electrically connect the ground pad to a ground layer in the package substrate.

Figure 5:
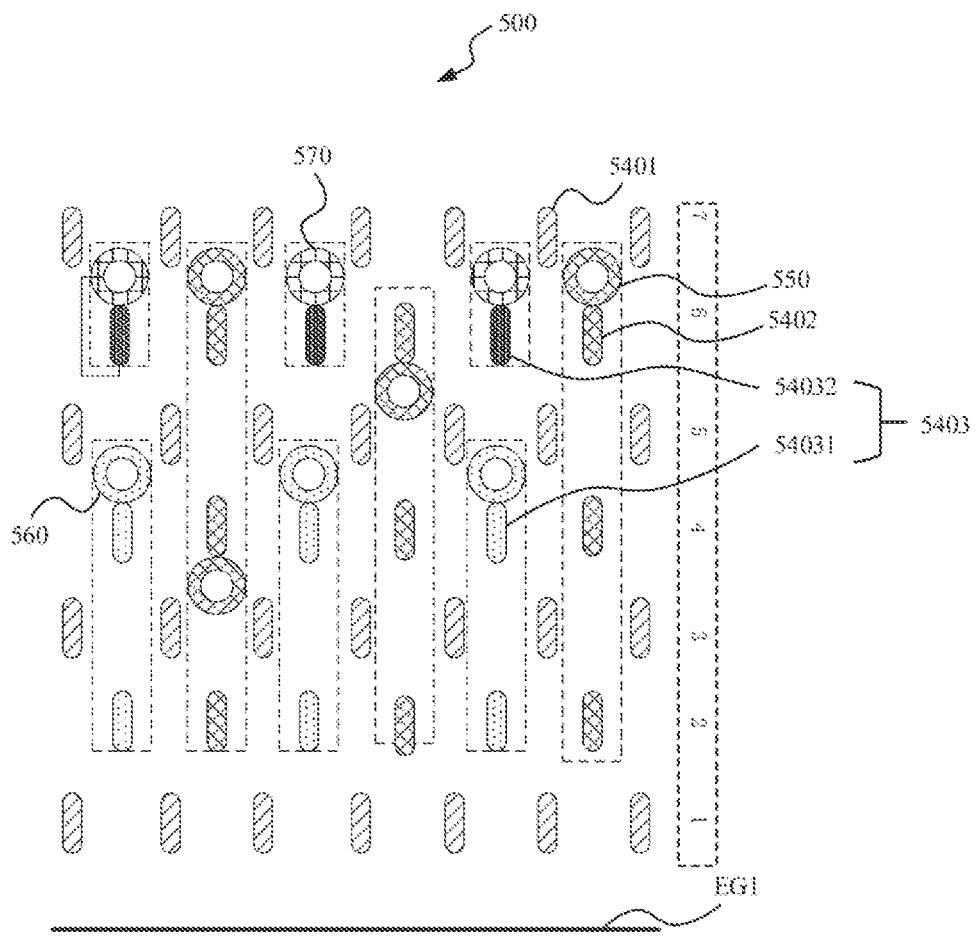
FIG. 5 is a schematic diagram of a structure formed by means of still another step of the method in FIG. 2 according to an exemplary embodiment of the present disclosure.

With reference to FIG. 5, an example structure 500 is obtained by adding a via hole on the basis of an example structure 400 of FIG. 4. The example structure 500 comprises signal pads 5401, ground pads 5402 and power pads 5403, and the power pad 5403 comprises a power pad 54031 of a first power network and a power pad 54032 of a second power network, FIG. 5 further shows the first edge EG1 of the orthographic projection region. As shown in FIG. 5, the power pad 5403 and the ground pad 5402, which serve as the non-signal pad, are provided with via holes 550, 560 and 570 to electrically connect the power pad 5403 to the power layer (not shown) in the package substrate and electrically connect the ground pad 5402 to the ground layer (not shown) in the package substrate.

According to some embodiments, providing the non-signal pad with the via hole may comprise: providing a plurality of power pads in different rows with a common power via hole, the common power via hole electrically connecting the plurality of power pads to the power layer; and providing a plurality of ground pads in different rows with a common ground via hole, the common ground via hole electrically connecting the plurality of ground pads to the ground layer. In an example of FIG. 5, ground pads 5402 in different even-numbered rows (the second, fourth, and sixth rows) are provided with the common ground via hole 550 to electrically connect the ground pads 5402 to the ground layer (not shown) in the package substrate. In addition, power pads 54031 of the first power network in different even-numbered rows (the second and fourth rows) are provided with the common power via hole 560 to electrically connect the power pads 54031 to the power layer (not shown) in the package substrate.

According to some embodiments, providing the plurality of power pads in different rows with the common power via hole may comprise: arranging the common power via hole to be aligned with the plurality of power pads in a column direction. Still referring to FIG. 5, each common power via hole 560 is aligned with two power pads 54031 of the first power network in the column direction.

According to some embodiments, a longitudinal direction of the plurality of power pads is parallel to the column direction. For each power pad, the longitudinal direction is a direction in which the power pad has a maximum size. Arranging the common power via hole to be aligned with the plurality of power pads in the column direction may comprise: arranging the common power via hole such that the distance between the common power via hole and one end of one of the plurality of power pads in the longitudinal direction is less than a threshold distance. The threshold distance may be 5 um, 10 um, 15 um, 20 um, etc. Therefore, there may be a direct contact between the common power via hole and one end of one of the plurality of power pads in the longitudinal direction, or there may be a gap therebetween. When there is a gap between the common power via hole and one end of the power pad, the two may be electrically connected to each other by means of wiring. Still referring to FIG. 5, a longitudinal direction of the power pad 5403 (that is, the direction in which the power pad 5403 has a maximum size) is parallel to the column direction, and the distance between each common power via hole 560 and one end of one power pad 54031 in the longitudinal direction is less than the threshold distance. In some embodiments, the common power via hole 560 is located at an upper end of the power pad 54031, and makes a direct contact with the upper end of the power pad 54031. In some embodiments, the diameter of the via hole itself is 100 um.

According to some embodiments, providing the plurality of ground pads in different rows with the common ground via hole may comprise: arranging the common ground via hole to be aligned with the plurality of ground pads in the column direction. Still referring to FIG. 5, the common ground via hole 550 is aligned with ground pads 5402 in different even-numbered rows (the second, fourth, and sixth rows) in the column direction.

According to some embodiments, a longitudinal direction of the plurality of ground pads is parallel to the column direction, and arranging the common ground via hole to be aligned with the plurality of ground pads in the column direction may comprise: arranging the common ground via hole such that the distance between the common ground via hole and one end of one of the plurality of ground pads in the longitudinal direction is less than a threshold distance. In some embodiments, the threshold distance may be 5 um, 10 um, 15 um, 20 um, etc. Therefore, there may be a direct contact between the common ground via hole and one end of one of the plurality of ground pads in the longitudinal direction, or there may be a gap therebetween. When there is a gap between the common ground via hole and one end of the ground pad, the two may be electrically connected to each other by means of wiring. Still referring to FIG. 5, a longitudinal direction of the ground pad 5402 (that is, the direction in which the ground pad 5402 has a maximum size) is parallel to the column direction, and the distance between each common ground via hole 550 and one end of one ground pad in the longitudinal direction is less than the threshold distance. In some embodiments, the common ground via hole 550 is located at an upper end of the ground pad 5402, and makes a direct contact with the upper end of the ground pad 5402.

By means of the above arrangement structure, the via hole for the non-signal pad (that is, the power pad and the ground pad) only occupies the pathway in the column direction, and thus has less impact on the wiring space. This facilitates leading out the required signal pads by means of a layer of wiring.

According to some embodiments, the method 200 may further optionally comprise step 204, as indicated by a dotted box in FIG. 2. In step 204, orientations of at least a part of the bump pads are adjusted.

Figure 6:
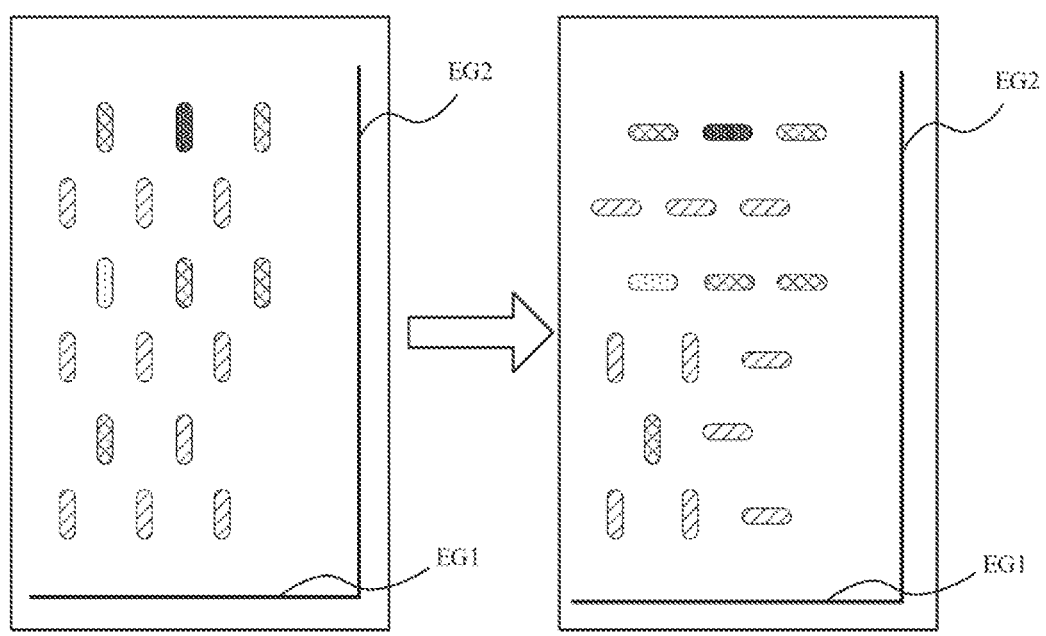
FIG. 6 is a schematic diagram of structural changes before and after execution of still yet another step of the method in FIG. 2 according to an exemplary embodiment of the present disclosure.

FIG. 6 shows changes of the orientations of a part of the bump pads before and after execution of step 204. As shown in FIG. 6, the orientations of the part of the bump pads are adjusted from a vertical direction to a horizontal direction. After the adjustment, a longitudinal direction of the bump pads is consistent with a wiring outgoing direction, and a gap for wiring outgoing is increased, such that more wirings can be arranged between adjacent rows. This makes it possible to use a layer of wiring to lead a signal pad out of an orthographic projection region. In an example of FIG. 6, two intersecting edges of the orthographic projection region are schematically represented by first and second edges EG1 and EG2.

According to some embodiments, no additional pad is provided between an array of the bump pads and at least the first edge of the orthographic projection region. For example, the array of the bump pads is located in a peripheral zone within the orthographic projection region, as shown in FIG. 6. In such an embodiment, arranging the orientations of the bump pads may comprise: orienting a first subset of the bump pads to have a first longitudinal direction perpendicular to the first edge; and orienting a second subset of the bump pads to have a longitudinal direction different from the first longitudinal direction. According to some embodiments, no additional pad is provided between the array of the bump pads and the intersecting first and second edges of the orthographic projection region. The second subset of the bump pads comprises: a part of bump pads in at least one row of bump pads in the array, the at least one row of bump pads as a whole being farther away from the first edge than other rows in the array; and a part of bump pads in at least one column of bump pads in the array, the at least one column of bump pads as a whole being closer to the second edge than other columns in the array. The first subset of the bump pads comprises bump pads, other than in the second subset, in the array of the bump pads.

Figure 7:
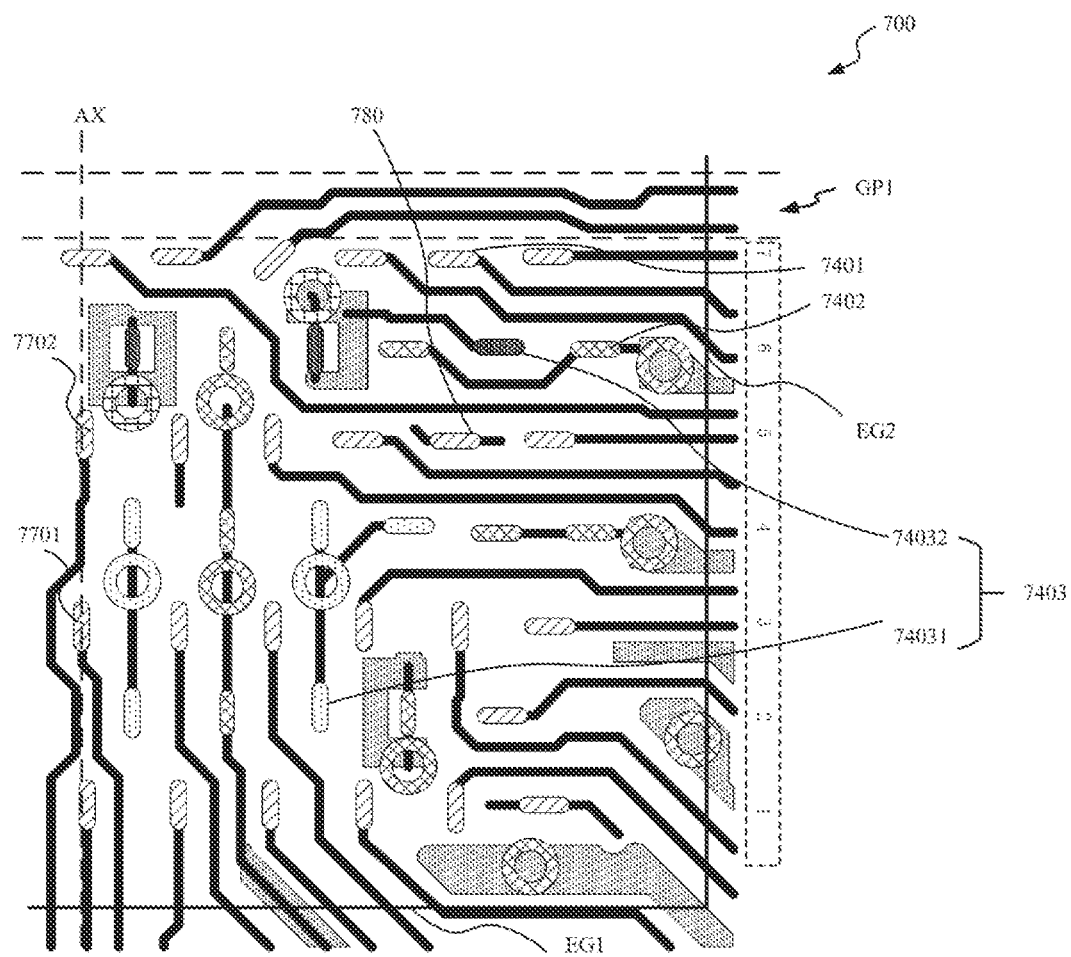
FIG. 7 is a schematic diagram of a right portion of a structure formed by means of still yet another step of the method in FIG. 2 according to an exemplary embodiment of the present disclosure.

Now refer to FIGS. 7 and 8. FIG. 7 shows a local region 700 (corresponding to an upper portion of the example structure 300 of FIG. 3) of an array of bump pads obtained by applying the wiring design method 200 of FIG. 2 to the example structure 300 of FIG. 3. FIG. 8 shows a local region 800 (corresponding to a lower portion of the example structure 300 of FIG. 3) of an array of bump pads obtained by applying the wiring design method 200 of FIG. 2 to the example structure 300 of FIG. 3.

In the local region 700 shown in FIG. 7, the array of the bump pads comprises signal pads 7401, ground pads 7402 and power pads 7403, and the power pad 7403 comprises a power pad 74031 of a first power network and a power pad 74032 of a second power network. No additional pad is provided between the array of the bump pads and the intersecting first and second edges EG1 and EG2 of the orthographic projection region, and the bump pads may thus be led out from the first and second edges EG1 and EG2. However, an additional pad (not shown in FIG. 7) may be provided between the array of the bump pads and other edges, other than the first and second edges, of the orthographic projection region, and thus the bump pads cannot be led out from these other edges. Therefore, it is necessary to properly set the orientations of the bump pads. In this example, the second subset of the bump pads comprises a part of bump pads in at least one row (for example, the fourth to seventh rows) of bump pads (the fourth to seventh rows as a whole are farther away from the first edge EG1 than other rows (that is, the first to third rows) in the array), and this part of bump pads is oriented to have a substantially horizontal longitudinal direction. In addition, the second subset of the bump pads further comprises a part of bump pads in at least one column (for example, the first to third columns from right to left) of bump pads (the first to third columns as a whole are closer to the second edge EG2 than other columns in the array), and this part of bump pads is also oriented to have a substantially horizontal longitudinal direction. The bump pads, other than those in the second subset, form the first subset of the bump pads, and they are oriented to have a first longitudinal direction perpendicular to the first edge EG1. In this way, the bump pads in the second subset are oriented differently from the bump pads in the first subset.

Similarly, in the local region 800 shown in FIG. 8, the array of the bump pads comprises signal pads 8401, ground pads 8402 and power pads 8403, and the power pad 8403 comprises a power pad 84031 of a first power network and a power pad 84032 of a second power network. In the local region 800, the second subset of the bump pads comprises a part of bump pads in at least one row (for example, the sixth to seventh rows) of bump pads (the sixth and seventh rows as a whole are farther away from the first edge EG1 than other rows in the array), and this part of bump pads is oriented to have a substantially horizontal longitudinal direction. The bump pads, other than those in the second subset, form the first subset of the bump pads, and they are oriented to have a first longitudinal direction perpendicular to the first edge EG1. Therefore, the bump pads in the second subset are oriented differently from the bump pads in the first subset.

In the embodiment described above, the row direction of the array may be parallel to the first edge, and the column direction of the array may be parallel to the second edge. For example, in FIG. 7, the row direction of the array is parallel to the first edge EG1, and the column direction of the array is parallel to the second edge EG2.

In step 205, a layer of wiring is used to lead a subset of the signal pads out of an orthographic projection region of the flip chip die on the package substrate, wherein the subset of the signal pads is configured to carry all functional signals required by design specifications of the flip chip die for the array of the bump pads. As used herein, the term "subset" comprises some or all of the listed items, that is, comprising the case of a "full set". The term "functional signals" refers to signals other than a power signal and a ground signal, such as a control signal and/or a data signal.

According to some embodiments, no additional pad is provided between the array of the bump pads and intersecting first and second edges of the orthographic projection region, and an additional pad is provided between the array of the bump pads and other edges, other than the first and second edges, of the orthographic projection region. Optionally, the row direction of the array may be parallel to the first edge, and the column direction of the array may be parallel to the second edge. In these embodiments, conducting wiring on the signal pads may comprise: on the basis of meeting a wiring width and wiring pitch specification, leading, with a gap between the array of the bump pads and other edges of the orthographic projection region, a first group of signal pads in the subset of the signal pads out of the orthographic projection region, wherein at least a part of signal pads located in a row in the array that is farthest away from the first edge belongs to the first group of signal pads; and leading with a gap between the array of the bump pads and the first and second edges, the remaining signal pads, other than the first group of signal pads, in the subset of the signal pads out of the orthographic projection region.

With reference to FIG. 7 no additional pad is provided between the array of the bump pads and the intersecting first and second edges EG1 and EG2, whereas an additional pad is provided between the array of the bump pads and other edges, other than the first and second edges EG1 and EG2, of the orthographic projection region. Specifically, FIG. 7 shows a gap GP1 between the array of the bump pads and another pad region of the package substrate. In addition, FIG. 8 shows a gap GP2 between the array of the bump pads and another pad region of the package substrate. FIG. 8 also shows a plurality of additional pads 8901 located at upper and left sides of the array of the bump pads. Due to the presence of these additional pads 8901, the wiring of the array of the bump pads is limited. In order to effectively use the space on the package substrate, with the gaps GP1 and GP2, a part of signal pads (that is, "the first group of signal pads") required by design specifications of a flip chip die in the seventh row (and optionally several other rows) may be led out of the orthographic projection region by means of a first group of wiring, and with the gap between the array of the bump pads and the first and second edges, the remaining signal pads required by the design specifications may be led out of the orthographic projection region by means of a second group of wiring.

Although an embodiment, in which an additional pad is provided between the array of the bump pads and other edges, other than the first and second edges EG1 and EG2, of the orthographic projection region, is described above with respect to FIG. 7, other embodiments are also possible.

According to some embodiments, no additional pad is provided between the array of the bump pads and only a first edge of the orthographic projection region, and an additional pad is provided between the array of the bump pads and other edges, other than the first edge, of the orthographic projection region. In these embodiments, a wiring method similar to the embodiments described above may be used. Specifically, conducting wiring on the signal pads may comprise: on the basis of meeting a wiring width and wiring pitch specification, leading, with a gap between the array of the bump pads and other edges of the orthographic projection region, a first group of signal pads in the subset of the signal pads out of the orthographic projection region by means of a first group of wiring, wherein at least a part of signal pads located in a row (which is the seventh row in the above example) in the array that is farthest away from the first edge belongs to the first group of signal pads; and leading, with a gap between the array of the bump pads and the first edge of the orthographic projection region, the remaining signal pads, other than the first group of signal pads, in the subset of the signal pads out of the orthographic projection region.

According to some embodiments, a part of signal pads located in non-edge rows of the array and in the same column have the same longitudinal direction, and the longitudinal direction is a direction in which each signal pad has a maximum size for the signal pad. Using the layer of wiring to lead the subset of the signal pads out of the orthographic projection region may comprise: for the part of signal pads located in the non-edge rows of the array and in the same column, on the basis of meeting a wiring width and wiring pitch specification: using the wiring to lead a first signal pad out from a first side of an axis in a longitudinal direction of the first signal pad; and using the wiring to lead a second signal pad located in the same column as the first signal pad and directly opposite to the first signal pad out from a second side of the axis, the second side being opposite to the first side with respect to the axis. Herein, "non-edge rows" refers to a set of rows to m, where 1<m<N, m is an integer, and N is a total number of rows of the array of the bump pads.

With reference to FIG. 7, edge rows comprise the first and seventh rows, and non-edge rows comprise the second, third, fourth, fifth, and sixth rows, wherein signal pads 7701 located in the third row and signal pads 7702 located in the fifth row are located in the same column, and the signal pads 7701 are directly opposite to the signal pads 7702. As shown in FIG. 7, the direction in which the signal pad 7701 has a maximum size is the column direction, and the direction in which the signal pad 7702 has a maximum size is also the column direction. Therefore, the signal pad 7701 and the signal pad 7702 have the same longitudinal direction, and the signal pad 7701 has an axis AX in the longitudinal direction thereof. On the basis of meeting a wiring width and wiring pitch specification: the signal pad 7701 is led out of a first edge EG1 from the first side, for example, the left side, of the axis AX in the longitudinal direction of the signal pad 7701 by using the wiring, and the signal pad 7702 is led out of the first edge EG1 from the second side, for example, the right side, of the axis AX by using the wiring. In an alternative embodiment, also by using the wiring, the signal pad 7701 may be led out from the right side of the axis AX and the signal pad 7702 may be led out from the left side of the axis AX.

For a signal pad (for example, a bump pad 780 in FIG. 7 or a bump pad 880 in FIG. 8) that is not required to be led out according to design specifications of a flip chip die, connectionless processing can be conducted. For connectionless bump pads, no wiring is needed, such that the wiring space may be saved. In FIGS. 7 and 8, setting short leads at both ends of the connectionless bump pad 780 or 880 is considered on the basis of mechanical factors of the bump pad, and such a setting can ensure mechanical stability of the package substrate.

According to some embodiments, the wiring width and wiring pitch specification allows at most two wirings to pass between every two bump pads.

The package substrate has certain requirements for both a wiring width and a wiring interval. For example, the wiring width and the wiring pitch are both not less than 20 um. An example of the wiring width and wiring pitch specification is listed in Table 1 below. Reference may be made to FIG. 1 for items represented by symbols A, B, C, E, and F, wherein A is a pad spacing, B is the distance from a pad to an adjacent wiring edge, C is a pad width, D is a pad length, E is a wiling width, and F is a wiring interval.

TABLE 1

| Symbol | Optimal value (um) | Minimum value (um) |
| --- | --- | --- |
| A | 160 | 140 |
| B | 17.5 | 15 |
| C | 30 | 25 |
| D | 90 | 80 |
| E | 25 | 20 |
| F | 25 | 20 |

It is to be understood that the above numerical values are merely exemplary descriptions, and do not limit the present disclosure. Based on such a wiring width and wiring pitch specification, with reference to FIG. 1, two signal lines 170 can pass between two bump pads 140. Therefore, this facilities leading a signal pad out of a package substrate by means of a layer of wiring.

By means of the wiring design method 200 described above, a package substrate with a four-layer structure may be realized: a signal wiring layer, a power layer, a ground layer and a package solder ball layer. This reduces the substrate processing difficulty, shortens the substrate delivery time and reduces substrate costs. Since the required signal pads are led out by means of a layer of wiring, no via hole needs to be provided for the signal pads. This may allows the power pad and the ground pad to be fully connected to the power layer and the ground layer, respectively, thereby ensuring that the voltage drop is within a small range.

According to some embodiments, the wiring design method 200 may further comprise, before adjusting the positions of the bump pads: setting the shape of the bump pads, and setting the size of the bump pads. According to some embodiments, setting the shape of the bump pads may comprise: setting the bump pads such that an orthographic projection of each bump pad on the package substrate has a rounded rectangle shape. According to some embodiments, arranging the size of the bump pads may comprise: on the basis of meeting a wiring width and wiring pitch specification, setting each bump pad such that the length of the bump pad is greater than three times the width of the bump pad.

Now refer to FIG. 9. A left half portion of FIG. 9 schematically shows a cross-sectional view of a conductive bump 930 and a bump pad 940, which bond with each other, and a right half portion of FIG. 9 schematically shows a top view of the conductive bump 930 and the bu p pad 940. It may be seen from the top view that an orthographic projection of the bump pad 940 on the package substrate is in the shape of a rounded rectangle. In this context, an ellipse may also be considered as a special rounded rectangle. In an example of FIG. 9, the bump pad 940 has a length of 85 um and a width of 25 um. Compared with round pads, pads in the shape of a rounded rectangle or an ellipse are used in order to reduce the occupied area and increase the wiring space. In some examples, a trace of 20 um may be used both inside and outside a bump pad region, and an impedance of 50 Ohm may also be realized, such that a better signal quality may be obtained.

According to some embodiments, the wiring design method 200 may further comprise, after step 203 of providing the non-signal pad with the via hole: determining whether the power pad is electrically connected to the power layer by means of a corresponding one of the via holes and whether the ground pad is electrically connected to the ground layer by means of a corresponding one of the via holes; and proceeding to step 204 of adjusting the orientations of the bump pads, in response to determining that the power pad has been electrically connected to the power layer and the ground pad has been electrically connected to the ground layer.

According to some embodiments, the wiring design method 200 may further comprise: determining whether the subset of the signal pads has been led out of the orthographic projection region by means of a layer of wiring; and conducting electrical simulation on the package substrate, in response to determining that the subset of the signal pads has been led out of the orthographic projection region by means of the layer of wiring.

According to some embodiments, the wiring design method 200 may further comprise: generating a wiring design file for the package substrate, in response to a result of the electrical simulation indicating that design specifications of the flip chip die are met.

These additional processing for the wiring design method 200 will be described below with reference to FIG. 10. FIG. 10 shows a specific example 1000 of the wiring design method 200. In this example, steps 1001, 1004, 1005 and 1007 respectively correspond to steps 201, 202, 203 and 204 described above with respect to FIG. 2, and steps 1008 and 1009 correspond to step 205 described above with respect to FIG. 2. Step 1002 of setting the shape of the bump pads and step 1003 of setting the size of the bump pads have also been described above with reference to FIG. 9. For the sake of brevity, the details of these steps will not be repeated herein.

In step 1006, after the non-signal pad (that is, the power pad and the ground pad) is provided with the via hole, it is checked whether non-signal wiring is completed. Specifically, it is determined whether the power pad is electrically connected to a power layer by means of a corresponding via hole and whether the ground pad is electrically connected to a ground layer by means of a corresponding via hole. If the power pad has been electrically connected to the power layer and the ground pad has been electrically connected to the ground layer, the process proceeds to step 1007 to adjust the orientations of the bump pads. Otherwise, the process returns to step 1004 to adjust the positions of the bump pads again, and steps 1005 and 1006 are executed again until the non-signal wiring is completed.

In step 1010, after signal pads required by design specifications of the flip chip die are led out by means of a layer of wiring, it is checked whether all the required signal pads are led out. Specifically, it is determined whether the subset of the signal pads (that is, the signal pads required by the design specifications of the flip chip die) has been led out of an orthographic projection region by means of the layer of wiring. If the subset of the signal pads has been led out of the orthographic projection region by means of the layer of wiring, electrical simulation is conducted on the package substrate. Otherwise, the process returns to step 1004 to adjust the positions of the bump pads again, and then the subsequent step is continued.

In step 1011, electrical simulation is conducted on the completed wiring design. By means of the electrical simulation, it is checked whether the wiring design meets a frequency design requirement specified in the design specifications of the flip chip. In some embodiments, for the wiring design applied to LPDDR4, a transmission rate of 3200 MBPS is required. If an electrical simulation result shows that the flip chip die can meet the frequency design requirement, the process proceeds to step 1012. Otherwise, the process returns to step 1008 to conduct wiring on the signal pads again.

In step 1012, a wiring design for the package substrate may be saved. The saved wiring design may be used in an actual package substrate manufacturing process.

It is to be understood that although various operations are illustrated and described above in a particular order, this should neither be understood as requiring that these operations must be executed in the particular order illustrated and described or in a sequential order, nor should it be understood that all operations illustrated and described must be executed to obtain a desired result. For example, in FIG. 2, the non-signal pad may be provided with the via hole (step 203) after the orientations of the bump pads are adjusted (step 204). In FIG. 10, step 1008 of conducting wiring on signal pads in the first, third and fifth rows may be executed simultaneously with step 1009 of conducting wiring on signal pads in the seventh row, or executed after step 1009. More generally, steps 1008 and 1009 may be combined into one step, such as step 205 shown in FIG. 2.

According to one aspect of the present disclosure, a wiring structure for a package substrate in a flip chip is provided. The flip chip comprises the package substrate and a flip chip die opposite to the package substrate. The wiring structure comprises: bump pads arranged in an array of rows and columns on the package substrate, wherein the bump pads are configured to bond with conductive bumps on the flip chip die, the bump pads comprise signal pads and non-signal pads, and the non-signal pads comprise power pads and ground pads; via holes comprising a power via hole and a ground via hole, wherein the power via hole is configured to electrically connect the power pad to a power layer in the package substrate, and the ground via hole is configured to electrically connect the ground pad to a ground layer in the package substrate; and a layer of wiring configured to lead a subset of the signal pads out of an orthographic projection region of the flip chip die on the package substrate, wherein the subset of the signal pads is configured to carry all functional signals required by design specifications of the flip chip die.

According to one aspect of the present disclosure, a flip chip is provided. The flip chip comprises: a flip chip die, a package substrate opposite to the flip chip die, and any wiring structure as described above.

The wiring structure and the flip chip have been described in detail above with respect to FIGS. 1 to 10, and will not be repeated herein for the sake of brevity. They have the same advantages as those described above with respect to the wiring design method 200.

In some embodiments of the present disclosure, by setting the shape, size, positions and/or orientations of bump pads, the space for signal wiring is increased, so that all required signal pads can be led out by using a layer of wiring. In some embodiments, a design of a 4-layer package substrate may be realized. In some embodiments, in the package substrate manufactured by means of the wiring design method, no via hole is required for the signal pads, such that sufficient connection of a power supply may be realized, and the voltage drop on a power network may be ensured to be within a small range. In some embodiments, the wiring on all signal pads may have a uniform width on a signal path, thereby realizing continuous signal impedance so as to facilitate the improvement of signal quality.

Although the present disclosure has been illustrated and described in detail in the drawings and the foregoing description, such illustration and description should be considered illustrative and schematic, rather than limiting; and the present disclosure is not limited to the disclosed embodiments. By studying the drawings, the disclosure, and the appended claims, those skilled in the art can understand and implement modifications to the disclosed embodiments when practicing the claimed subject matter. In the claims, the word "comprising" does not exclude other elements or steps not listed, the indefinite article "a" or "an" does not exclude plural, and the term "a plurality of" means two or more. The mere fact that certain measures are recited in mutually different dependent claims does not indicate that a combination of these measures cannot be used to get benefit.

What is claimed is:

1. A wiring structure for a package substrate in a flip chip, wherein the flip chip comprises the package substrate and a flip chip die opposite to the package substrate, the wiring structure comprising:
    bump pads, arranged in an array of rows and columns on the package substrate, wherein the bump pads are configured to bond with conductive bumps on the flip chip die, the bump pads comprise signal pads and non-signal pads, and the non-signal pads comprise power pads and ground pads, wherein the signal pads are arranged over an entire area in which the bump pads are arranged, and the non-signal pads are arranged over the entire area in which the bump pads are arranged, and wherein bump pads of odd-numbered rows and bump pads of even-numbered rows are staggered relative to each other in a column direction of the array;
    via holes, comprising a power via hole and a ground via hole, wherein the power via hole is configured to electrically connect the power pad to a power layer in the package substrate, and the ground via hole is configured to electrically connect the ground pad to a ground layer in the package substrate; and
    a layer of wiring configured to lead a subset of the signal pads out of an orthographic projection region of the flip chip die on the package substrate, wherein the subset of the signal pads is configured to carry all functional signals required by design specifications of the flip chip die for the array of the bump pads.

2. The wiring structure of claim 1,
    wherein in each odd-numbered row, the number of signal pads is greater than that of non-signal pads; and
    wherein in each even-numbered row, the number of signal pads is less than that of non-signal pads.

3. The wiring structure of claim 1, wherein in first n rows of the array, the number of signal pads is greater than that of non-signal pads, with 0<n<N, n being an integer, and N being a total number of rows of the array.

4. The wiring structure of claim 1, wherein
    the power via hole comprises a common power via hole, the common power via hole electrically connecting a plurality of power pads in different rows to the power layer; and
    the ground via hole comprises a common ground via hole, the common ground via hole electrically connecting a plurality of ground pads in different rows to the ground layer.

5. The wiring structure of claim 4, wherein the common power via hole is aligned with the plurality of power pads in a column direction of the array.

6. The wiring structure of claim 5,
    wherein a longitudinal direction of the plurality of power pads is parallel to the column direction, the longitudinal direction being a direction in which each power pad has a maximum size for the power pad, and
    wherein a distance between the common power via hole and one end of one of the plurality of power pads in the longitudinal direction is less than a threshold distance.

7. The wiring structure of claim 4, wherein the common ground via hole is aligned with the plurality of ground pads in a column direction of the array.

8. The wiring structure of claim 7,
    wherein a longitudinal direction of the plurality of ground pads is parallel to the column direction, the longitudinal direction being a direction in which each ground pad has a maximum size for the ground pad, and
    wherein a distance between the common ground via hole and one end of one of the plurality of ground pads in the longitudinal direction is less than a threshold distance.

9. The wiring structure of claim 1,
    wherein no additional pad is provided between the array of the bump pads and intersecting first and second edges of the orthographic projection region, and an additional pad is provided between the array of the bump pads and other edges, other than the first and second edges, of the orthographic projection region; and
    wherein the layer of wiring meets a wiring width and wiring pitch specification, and comprises:
    a first group of wiring, which leads, with a gap between the array of the bump pads and other edges of the orthographic projection region, a first group of signal pads in the subset of the signal pads out of the orthographic projection region, wherein at least a part of signal pads located in a row in the array that is farthest away from the first edge belongs to the first group of signal pads; and a second group of wiring, which leads, with a gap between the array of the bump pads and the first and second edges, remaining signal pads, other than the first group of signal pads, in the subset of the signal pads out of the orthographic projection region.

10. The wiring structure of claim 9, wherein the wiring width and wiring pitch specification allows at most two wirings to pass between every two bump pads.

11. The wiring structure of claim 1,
wherein no additional pad is provided between the array of the bump pads and only a first edge of the orthographic projection region, and an additional pad is provided between the array of the bump pads and other edges, other than the first edge, of the orthographic projection region; and
wherein the layer of wiring meets a wiring width and wiring pitch specification, and comprises:
a first group of wiring, which leads, with a gap between the array of the bump pads and other edges of the orthographic projection region, a first group of signal pads in the subset of the signal pads out of the orthographic projection region, wherein at least a part of signal pads located in a row in the array that is farthest away from the first edge belongs to the first group of signal pads; and
a second group of wiring, which leads, with a gap between the array of the bump pads and the first edge of the orthographic projection region, remaining signal pads, other than the first group of signal pads, in the subset of the signal pads out of the orthographic projection region.

12. The wiring structure of claim 1,
wherein a part of signal pads located in non-edge rows of the array and in the same column have the same longitudinal direction, and the longitudinal direction is a direction in which each signal pad has a maximum size for the signal pad; and
wherein for the part of signal pads located in the non-edge rows of the array and in the same column, on the basis of meeting a wiring width and wiring pitch specification:
a first signal pad is led out from a first side of an axis in a longitudinal direction of the first signal pad; and
a second signal pad located in the same column as the first signal pad and directly opposite to the first signal pad is led out from a second side of the axis, the second side being opposite to the first side with respect to the axis.

13. The wiring structure of claim 1, wherein a plurality of power pads in different rows are directly opposite to each other in a column direction of the array, and a plurality of ground pads in different rows are directly opposite to each other in the column direction.

14. The wiring structure of claim 1, wherein no additional pad is provided between the array of the bump pads and at least a first edge of the orthographic projection region,
a first subset of the bump pads has a first longitudinal direction perpendicular to the first edge, and
a second subset of the bump pads has a longitudinal direction different from the first longitudinal direction.

15. The wiring structure of claim 14,
wherein no additional pad is provided between the array of the bump pads and intersecting first and second edges of the orthographic projection region;
wherein the second subset of the bump pads comprises:

a part of bump pads in at least one row of bump pads in the array, the at least one row of bump pads as a whole being farther away from the first edge than other rows in the array, and
a part of bump pads in at least one column of bump pads in the array, the at least one column of bump pads as a whole being closer to the second edge than other columns in the array; and
wherein the first subset of the bump pads comprises bump pads, other than those in the second subset, in the array of the bump pads.

16. The wiring structure of claim 1, wherein for each of the bump pads, an orthographic projection of the bump pad on the package substrate has a rounded rectangle shape.

17. The wiring structure of claim 16, wherein on the basis of meeting a wiring width and wiring pitch specification, the length of each bump pad is greater than three times the width of the bump pad.

18. A flip chip, comprising:
a flip chip die;
a package substrate, opposite to the flip chip die; and
a wiring structure, wherein the wiring structure comprises:
bump pads, arranged in an array of rows and columns on the package substrate, wherein the bump pads are configured to bond with conductive bumps on the flip chip die, the bump pads comprise signal pads and non-signal pads, and the non-signal pads comprise power pads and ground pads, wherein the signal pads are arranged over an entire area in which the bump pads are arranged, and the non-signal pads are arranged over the entire area in which the bump pads are arranged, and wherein the bump pads of odd-numbered rows and bump pads of even-numbered rows are staggered relative to each other in a column direction of the array;
via holes, comprising a power via hole and a ground via hole, wherein the power via hole is configured to electrically connect the power pad to a power layer in the package substrate, and the ground via hole is configured to electrically connect the ground pad to a ground layer in the package substrate; and
a layer of wiring configured to lead a subset of the signal pads out of an orthographic projection region of the flip chip die on the package substrate, wherein the subset of the signal pads is configured to carry all functional signals required by design specifications of the flip chip die for the array of the bump pads.

19. A wiring design method for a package substrate in a flip chip, wherein the flip chip comprises the package substrate and a flip chip die opposite to the package substrate, the method comprises the following steps:
arranging bump pads in an array of rows and columns, wherein the bump pads are configured to bond with conductive bumps on the flip chip die, the bump pads comprise signal pads and non-signal pads, and the non-signal pads comprise power pads and ground pads, wherein the signal pads are arranged over an entire area in which the bump pads are arranged, and the non-signal pads are arranged over the entire area in which the bump pads are arranged, and wherein bump pads of odd-numbered rows and bump pads of even-numbered rows are staggered relative to each other in a column direction of the array;
providing the non-signal pad with a via hole to electrically connect the power pad to a power layer in the package substrate and electrically connect the ground pad to a ground layer in the package substrate; and using a layer of wiring to lead a subset of the signal pads out of an orthographic projection region of the flip chip die on the package substrate, wherein the subset of the signal pads is configured to carry all functional signals required by design specifications of the flip chip die for the array of the bump pads.

* * * * *